(12) United States Patent
Geyer et al.

(10) Patent No.: US 7,719,165 B2
(45) Date of Patent: May 18, 2010

(54) METHOD AND CIRCUIT ARRANGEMENT FOR THE PRECISE DYNAMIC DIGITAL CONTROL OF ESPECIALLY PIEZOELECTRIC ACTUATORS FOR MICROPOSITIONING SYSTEMS

(75) Inventors: Bernhard Geyer, Karlsruhe (DE); Berthold Besch, Karlsruhe (DE); Scott Jordan, San Jose, CA (US)

(73) Assignee: Physik Instruemnt (PI) GmbH & Co. KG, Karlsruhe (DE)

( * ) Notice: Subject to any disclaimer, the term of this patent is extended or adjusted under 35 U.S.C. 154(b) by 850 days.

(21) Appl. No.: 10/568,139

(22) PCT Filed: Aug. 3, 2004

(86) PCT No.: PCT/EP2004/008695
§ 371 (c)(1),
(2), (4) Date: Oct. 20, 2006

(87) PCT Pub. No.: WO2005/017634
PCT Pub. Date: Feb. 24, 2005

(65) Prior Publication Data
US 2007/0043451 A1    Feb. 22, 2007

(30) Foreign Application Priority Data
Aug. 11, 2003 (DE) .............................. 103 36 820

(51) Int. Cl.
*H01L 41/09* (2006.01)
(52) U.S. Cl. .................................. 310/317; 310/316.01
(58) Field of Classification Search ............ 310/316.01, 310/317
See application file for complete search history.

(56) References Cited

U.S. PATENT DOCUMENTS

| 5,001,649 | A | * | 3/1991 | Lo et al. ...................... 702/124 |
| 5,051,646 | A | * | 9/1991 | Elings et al. ................. 310/317 |
| 5,178,307 | A |   | 1/1993 | Wright et al. |
| 5,568,003 | A | * | 10/1996 | Deck ...................... 310/316.01 |
| 5,783,899 | A | * | 7/1998 | Okazaki ...................... 310/317 |
| 6,084,754 | A |   | 7/2000 | Smith et al. |

(Continued)

FOREIGN PATENT DOCUMENTS

DE        195 05 610 A1    8/1996

(Continued)

*Primary Examiner*—Thomas M Dougherty
(74) *Attorney, Agent, or Firm*—Merchant & Gould P.C.

(57) ABSTRACT

The invention relates to a method and a circuit arrangement for the precise, dynamic, digital control of especially piezoelectric actuators for micropositioning systems, comprising a regulator, whereby in order to minimise position order deviations the future system behaviour is estimated and current correction signals for the purpose of a feedforward correction are obtained. According to the invention, the signal of the command variable is passed via a switchable bypass to a digital/analog converter with highest resolution for the purpose of reducing the latency times in the feedforward loop of the sampling system, with said converter being operated at the sampling rate of the sampling system. The feedforward loop leads to a fast digital/analog converter which is controlled independent of the sampling system. The output signals of the converters, which represent control voltages are supplied in an added-up form to the device to be controlled, in particular, to a piezoelectric actuator which together with a position sensor forms the controlled system.

16 Claims, 2 Drawing Sheets

Figure 1:
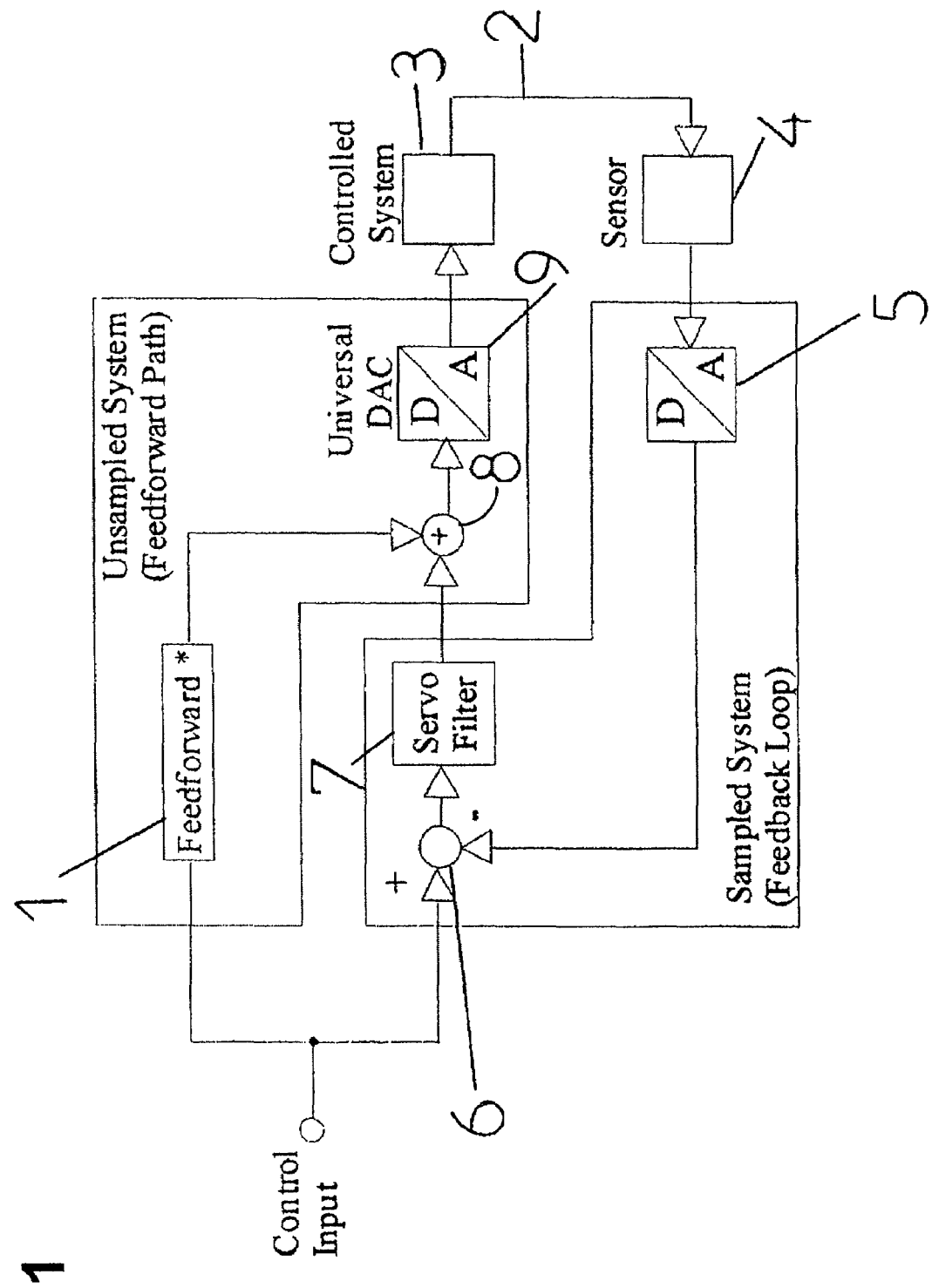

U.S. PATENT DOCUMENTS 6,308,106 B1    10/2001  Ameri et al.
6,313,564 B1 *  11/2001  Kataoka et al. ........ 310/316.01
6,570,730 B1 *   5/2003  Lewis et al. ................... 360/75

FOREIGN PATENT DOCUMENTS

DE    199 23 462 C 1    11/2000
DE    199 23 462 C1     11/2000

* cited by examiner

METHOD AND CIRCUIT ARRANGEMENT FOR THE PRECISE DYNAMIC DIGITAL CONTROL OF ESPECIALLY PIEZOELECTRIC ACTUATORS FOR MICROPOSITIONING SYSTEMS

The invention relates to a method and a circuit arrangement for the precise, dynamic, digital control of especially piezoelectric actuators for micropositioning systems, comprising a regulator, preferably a PID regulator, whereby, in order to minimise position order deviations, the future system behaviour is estimated and current correction signals for the purpose of feedforward correction are obtained, according to the preamble clause of claim 1 or 11, respectively.

Feedforward control systems are known in the state of the art.

In PID regulators or PID algorithms, respectively, there will be a correction signal only, if a system deviation exists. This means that principally position order errors have to be assumed. A feedforward control is directed at minimising these position order errors. The future system behaviour is estimated by a feedforward control, and the current correction signals are set accordingly. The corrections are generally made by multiplying the necessary speeds with the speed feedforward gain factor. A similar method may be utilised in order to perform an acceleration feedforward correction. In this manner it is possible to reduce the position order error in acceleration and deceleration operations of, e.g. actuator systems.

In accordance with DE 696 06 784 T2, feedforward control principles are e.g. employed in the positioning of a magnetoresistive head, for compensating the acoustic feedback in a system for the active noise reduction in accordance with DE 195 05 610 A1, in the yaw control for rotary-wing aircraft in accordance with DE 692 05 173 T2 and in other fields of the art.

Also known are positioning apparatuses with a positioning drive comprising especially a piezoceramic actuator, a position sensor, and a drive control means which at its input side is connected with a control signal input means as well as in a closed loop with the position sensor for the positioning drive, which is adapted for the output of preshaped drive signals to the positioning drive. Such a known positioning apparatus in accordance with DE 199 23 462 C2 comprises a controllable filter with variable filter coefficient, which is connected with a filter coefficient calculating unit via a control input, which is connected with the control signal input means via a first input and with at least with the position sensor via a second input and calculates in real time the current new filter coefficients from the input set position control signals as well as from the detected actual position signals. This positioning apparatus is able to respond to changed system conditions in a particularly flexible manner.

From studies originating from the applicant, it was found that feedforward systems in analog controllers, e.g. for the operation of piezoelectric actuators may essentially readily be realised. Difficulties will be encountered, however, if a digital controller is to be realised because the sampling operation generates principal latency times which considerably limit the inherently given dynamic advantage of the feedforward loop. Furthermore, other waiting times, partially with variable lengths, exist in known digital control units so that primarily analog controllers have been relied on for highly dynamic applications.

The known state of the art has hitherto not been able to combine the dynamics of fast piezoelectric actuators with the advantages of digital systems, such as higher precision, repeatability, exchangeability, and flexibility.

Based on the above, it is therefore the object of the invention to specify a method and a circuit arrangement for the precise, dynamic, digital control of especially piezoelectric actuators for micropositioning systems without essential restrictions existing with respect to the highly dynamic control requirements to be met be by the system.

The solution of the object of the invention in terms of method is effected by a teaching according to the definition of claim 1, and in terms of the circuit arrangement by the combined features according to claim 11, with the dependent claims at least representing useful embodiments and developments.

The basic idea of the invention is to provide a quasi second signal path which is independent of the sampling control loop proper. This allows the realisation of a fast digital feedforward control by bypassing the actual sampling system. In other words, the latency time in the feedforward loop of the sampling system can be reduced in that primarily via the command variable, the feedforward loop and a fast digital/analog converter the piezoelectric actuator is controlled, and secondarily the controlled system with position sensor is operated in a subordinate manner in order to avoid static errors.

The method and the circuit arrangement according to the invention permit to specify a digital, single or multi-axis high-speed control of piezoelectric actuators, with the circuit engineering expenditure being moderate and with the advantageous possibility of effecting changes of the filter properties in the circuit arrangement by a program-related specification of various parameters so that also a customised optimisation to the relevant application task becomes possible.

For the reduction of the latency times in the feedforward loop of the sampling system, the signal of the command variable is led to the above mentioned digital/analog converter of maximum resolution by means of a digital interface via a switchable bypass, with this digital/analog converter to be operated with the sampling rate of the sampling system.

The feedforward loop further leads to a second fast digital/analog converter which is controlled independent of the sampling system. The control voltages representing output signals of the converters are then supplied in an added-up form to the device to be controlled, in particular to the piezoelectric actuator which together with a position sensor forms the controlled system proper.

In addition, there is the possibility of effecting weighting and/or filtering of the signals supplied to the fast digital/analog converter.

The same command variable may be applied to both the fast first digital/analog converter of the controlled system and the high-resolution second digital/analog converter. The second digital/analog converter is consequently optimised to the control properties, in particular to the highest resolution, with the first digital/analog converter being directed to the shortest possible latency time, and the control of this fast converter being operated independent of the sampling system, so that no jitter occurs.

The optional weighting and/or filtering of the signals supplied to the fast converter may be performed dependent on the system properties.

It is also the purpose of the invention to perform a linearisation of the controlled system in order to prevent systematic errors in the signal paths. For the purpose of reducing potential system resonances, in one embodiment of the invention a specific pre-distortion of control voltages and/or an arrangement of band elimination filters may be provided.

Switching means and/or control commands permit to supply command variable changes both to the first fast digital/analog converter, the second, high-precision converter or to both converters. Various command variables may selectively be fetched via further switching means.

Filter and/or weighting functions for the command variable of the controlled system may be activated via the switching means.

In lieu of two discrete converters, each of which being optimised to the desired properties, there is also the possibility to employ a single digital/analog converter which has switchable or optimised functionalities with respect to resolution or speed, respectively.

In the basic principle of the circuit arrangement for the precise, dynamic, digital control of especially piezoelectric actuators for micropositioning systems, the command variable input is applied to a feedforward control loop and a comparator via a digital interface. The digital interface is preferably suited for the parallel data transfer and designed as PIO (parallel input-output).

The digital output signal of the position sensor sampling controlled system is applied to the comparator input of the comparator.

The comparator output is connected with an adder, to the other input of which the feedforward control loop is connected.

Ultimately, the output of the adder leads to a digital/analog converter which provides the control signal for the actuator, especially the piezoelectric actuator, at its output.

Alternatively, the comparator output may lead to the input of a high-resolution digital/analog converter whose output is connected with the first input of the adder, and the feedforward control loop may lead to the input of a fast digital/analog converter whose output is connected with the second input of the adder in order to primarily control the actuator via the command variable, the feedforward loop, and the fast digital/analog converter and to secondarily operate the controlled system with position sensor in a subordinate manner in order to avoid static errors.

In a further embodiment of the invention, an adjustable notch filter may be provided between a power amplifier for controlling the piezoelectric actuator and the output of the adder, which may optionally also be bridged.

The inventive circuit arrangement thus consists of the assemblies for detecting the sensor positions, the assembly for the digital sensor signal processing by means of a DSP (digital signal processor), the piezoelectric actuator including the above described D/A converters, and a digital, in particular, PIO interface.

In an embodiment of the invention the first fast digital/analog converter is selected as a 16-bit converter and the high-resolution converter as one with 20-bit resolution. The fast converter may directly be controlled via the PIO interface, with another serial interface being provided for controlling the high-resolution converter.

The position detection of the piezoelectric actuator is based on a sensor arrangement which converts the mechanical movement or the mechanical position, respectively, into analog voltages. Normally, the obtained analog voltage is proportional to the changes of position. An analog/digital converter converts the analog voltages into a digital signal which will be subjected to a lowpass filtering and a linearisation, if required, and then be applied to the comparing input of the comparator, which results in a feedback loop.

All in all, the present invention is able to specify a method and a novel circuit arrangement for the precise, dynamic, digital control of especially piezoelectric actuators for micropositioning systems which realise minimum latency times ranging from 2 to 5 μs, so that the dynamics of fast piezoelectric actuators is compatible with the desired digital control. Due to the fact that the command variable primarily functions as a control mechanism the major task of the control is to reduce the inevitable static error. Because of a variable command structure, any change in the command variable may be led either to the fast digital/analog converter, the high-resolution converter, or the servo-control, respectively, but also to both signal paths.

Figure 2:
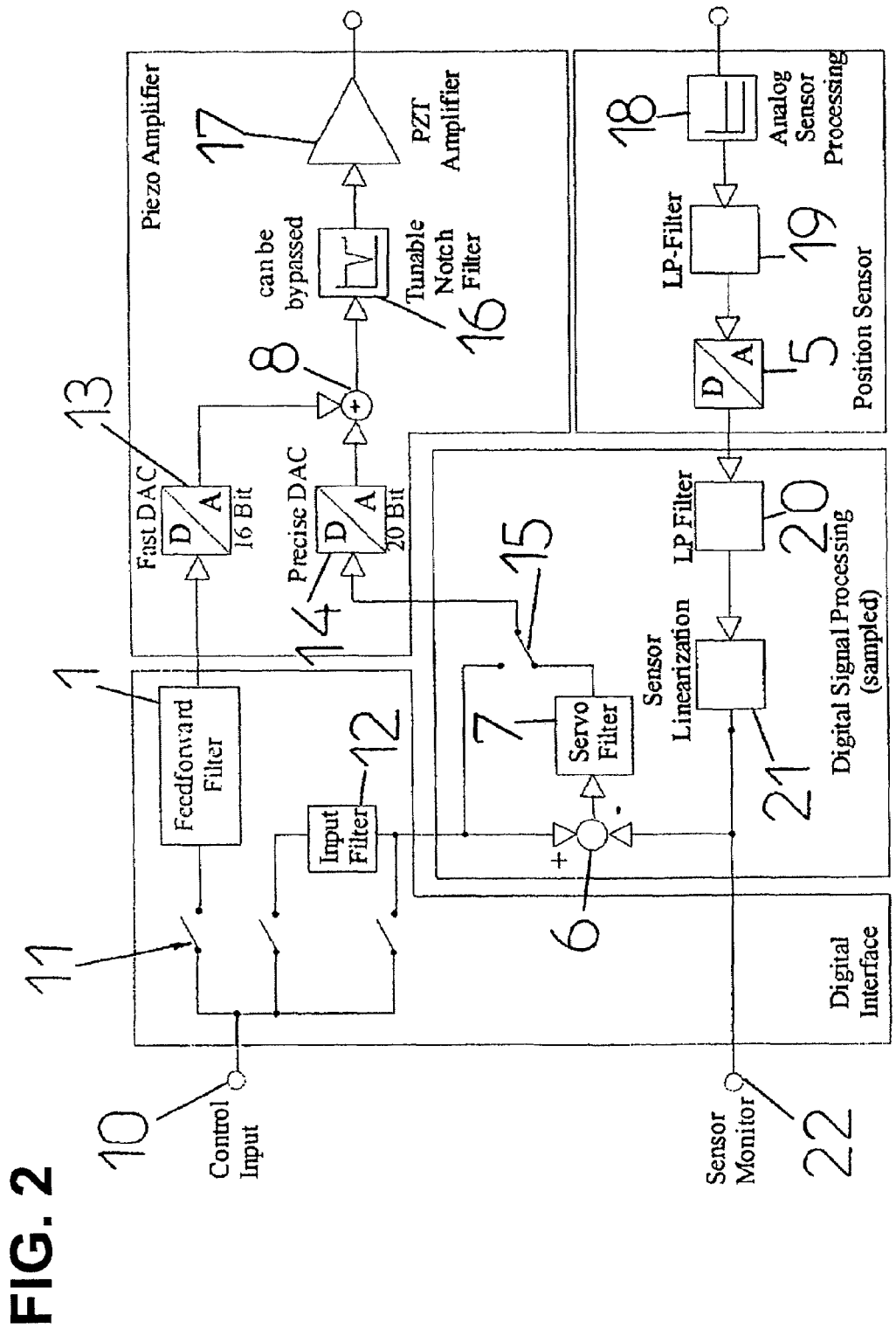

The invention will be described in more detail by means of an embodiment as well as with reference to figures in which:

FIG. 1 is a principal illustration of the basic functions of the circuit arrangement-sampled-unsampled; and FIG. 2 is a detailed illustration of the circuit arrangement with two special digital/analog converters which are optimised with respect to their functions.

According to FIG. 1, a feedforward loop 1 and a controlled system 2 are assumed.

The controlled system 2 includes the system 3 to be controlled, e.g. a piezoelectric actuator, and further comprises a travel sensor 4. Associated with the controlled system 2 is an analog/digital converter 5 which is connected with the output side of the travel sensor 4.

This analog/digital converter 5 leads to an input of a comparator 6 whose output leads to the first input of an adder 8 via an optional servo filter 7. The output signal of the feedforward loop or of a feedforward filter, respectively, is applied to the second input of this adder 8.

The output of the adder 8 leads to a universal digital/analog converter 9 which may be operated both with high resolution and highly dynamic. This universal digital/analog converter 9 then provides the analog output signal for the piezoelectric actuator 3. For driving the piezoelectric actuator 3 suitable amplifiers are of course required which, for the sake of simplicity, are not shown in FIG. 1.

According to the more detailed illustration of the circuit arrangement in FIG. 2 the input 10 of the command variable is communicating via switch means 11 both with the feedforward loop 1 and via an input filter 12 with the controlled system. The input 10 of the command variable may here be configured as a digital interface, namely in a PIO and serial interface configuration, e.g. an RS 232 interface.

At the output side the feedforward loop 1 is led to a first fast digital/analog converter 13 whose output leads to the second input of the adder 8. The controlled system, i.e. the output of the servo filter 7, in turn leads to the input of a high-resolution digital/analog converter 14 whose output is applied to the first input of the comparator 8. For the selective application of the digital input of the converter 14, too, a switch means 15 is provided.

At the output of the adder 8 a tunable notch filter 16 is arranged which in turn communicates with an amplifier 17 whose output leads to a PZT element which is not illustrated, i.e. to a piezoelectric actuator.

The travel sensor 4 leads to a signal processing unit 18 via a corresponding input, downstream of which a bandpass filter 19 and the analog/digital converter 5 are arranged. The digital signal processing unit of the controlled system comprises a further bandpass filter 20 and an arrangement 21 for the linearisation of the sensor signals. The output of this unit 21 communicates with the comparing input of the comparator 6, and additionally provides a sensor monitoring signal to a dedicated output 22.

The above circuit arrangement which has been described with reference to the figures is able to apply one and the same command variable both to the first fast digital/analog converter of the controlled system and to the second high-resolution digital/analog converter of the controlled system, whereby a linearisation of the controlled system may be effected in order to avoid systematic errors in the signal paths.

The circuit arrangement may be operated in such a manner, that the control of the piezoelectric actuator is primarily effected via the command variable, feedforward loop, and the first fast digital/analog converter, while secondarily the controlled system with position sensor is operated in a subordinate manner in order to avoid static errors.

In the illustration according to FIG. 1 it is assumed that one single digital/analog converter is employed which, e.g. in a switchable manner, provides various functionalities with respect to the required resolution and speed.

LIST OF REFERENCE NUMERALS

1 Feedforward loop
2 Controlled system
3 Piezoelectric actuator
4 Travel sensor
5 Analog/digital converter
6 Comparator
7 Servo filter
8 Adder
9 Universal digital/analog converter
10 Command variable input
11 Switch means
12 Input filter
13 Fast digital/analog converter
14 High-resolution digital/analog converter
15 Switch means
16 Tunable notch filter
17 PZT amplifier
18 Analog sensor signal processing unit
19; 20 Bandpass filter
21 Means for sensor signal linearisation
22 Sensor monitoring output

The invention claimed is:

1. A method for the precise dynamic digital control of piezoelectric actuators for micropositioning systems having a proportional integral derivative (PID) regulator, the method comprising:
   estimating future system behavior to minimize order deviations;
   obtaining current correction signals a feedforward correction;
   reducing latency times in the feedforward loop of a sampling system, by applying a signal of a command via a switch having a switchable bypass to a high resolution digital/analog converter with the high resolution digital/analog converter being operated at a sampling rate of the sampling system, a PID feedforward loop further leading to a fast digital/analog converter which is controlled independently of the sampling system; and
   supplying output signals of the high resolution digital/analog converter and the fast digital/analog converter, which represent control voltages, in an added-up form to a piezoelectric actuator which together with a position sensor forms a controlled system.

2. The method in accordance with claim 1, further comprising supplying signals of a command variable to the high resolution digital/analog converter and carrying out weighting and/or filtering of the signals.

3. The method in accordance with claim 1, further comprising applying a same command variable to both the fast digital/analog converter and the high-resolution digital/analog converter.

4. The method in accordance with claim 1, further comprising linearizing the controlled system to avoid systematic errors in signal paths.

5. The method in accordance with claim 1, further comprising pre-distorting control voltages and/or arrangement of band elimination filters to reduce system resonances.

6. The method in accordance with claim 1, primarily operating the piezoelectric actuator in a controlled manner via a command variable, the feedforward loop, and the fast digital/analog converter; and secondarily operating the controlled system with position sensor in a subordinate manner.

7. The method in accordance with claim 1, providing changes of a command variable to the fast digital/analog converter, to the high-resolution converter, or to both converters via a switch and/or control commands.

8. The method in accordance with claim 1, further comprising selectively fetching various command variables via a switch.

9. A control circuit for outputting a control signal to an external system, said control circuit comprising:
   a feedback control path receiving a feedback signal from the external system and at least partially by digital signal processing generates a feedback control signal based on a control input signal and the feedback signal;
   a feed-forward control path, separate from the feedback control path, the feed-forward control path generating a feed-forward control signal based on the control input signal; and
   control signal generation circuitry generating the control signal based on the feedback control signal and the feed-forward control signal.

10. The control circuit of claim 9, wherein the feedback control path comprises a first digital-to-analog converter operating at a first sampling frequency; and wherein the feed-forward control path comprises a second digital-to-analog converter that operates at a second sampling frequency, the second sampling frequency being higher than the first sampling frequency.

11. The control circuit of claim 10, wherein the feedback signal comprises an analog signal; and wherein the feedback control path comprises an analog-to-digital converter that converts an analog signal obtained from the feedback signal into a digital signal on the basis of which the feedback control signal is generated, the analog-to-digital converter operating at the first sampling frequency.

12. The control circuit of claim 10, wherein the control signal is an analog control signal, and wherein the control signal generation circuitry comprises an adder adding an analog output of the first digital-to-analog converter to an analog output of the second digital-to-analog converter.

13. The control circuit of claim 9, wherein the control input signal is a digital control input signal.

14. The control circuit of claim 9, wherein at least one of the circuit control signal and the feedback signal is an analog signal.

15. The control circuit of claim 9, wherein the feedback signal and the control signal are analog signals, the feedback control signal and the feed-forward control signal are digital signals, the feedback control path comprises an analog-to-digital converter converting an analog signal obtained from the feedback signal into a digital signal on the basis of which the feedback control signal is generated, and the control signal generation circuitry comprises:

a digital to analog converter; and an adder adding the feedback control signal and the feed-forward control signal.

16. The control circuit of claim 15, wherein the adder adds the feedback control signal and the feed-forward control signal to obtain an intermediate signal, and wherein the digital-to-analog converter converts the intermediate signal into the control signal.

\* \* \* \* \*